(12) United States Patent
Sandström

(10) Patent No.: US 8,570,613 B2
(45) Date of Patent: Oct. 29, 2013

(54) LITHOGRAPHIC PRINTING SYSTEM WITH PLACEMENT CORRECTIONS

(75) Inventor: Torbjörn Sandström, Pixbo (SE)

(73) Assignee: Micronic Laser Systems AB, Taby (SE)

( * ) Notice: Subject to any disclaimer, the term of this patent is extended or adjusted under 35 U.S.C. 154(b) by 759 days.

(21) Appl. No.: 12/718,903

(22) Filed: Mar. 5, 2010

(65) Prior Publication Data

US 2010/0225974 A1 Sep. 9, 2010

Related U.S. Application Data

(60) Provisional application No. 61/158,310, filed on Mar. 6, 2009.

(51) Int. Cl.
*H04N 1/04* (2006.01)

(52) U.S. Cl.
USPC .......................... 358/474; 358/3.26; 358/475

(58) Field of Classification Search
USPC ............... 358/474, 3.26, 1.9; 355/67, 77; 382/100, 167
See application file for complete search history.

(56) References Cited

U.S. PATENT DOCUMENTS

| | | | |
|---|---|---|---|
| 2,894,066 A | | 7/1959 | Buckingham et al. |
| 2,978,535 A | | 4/1961 | Brown |
| 3,335,413 A | | 8/1967 | Glenn, Jr. |
| 4,123,695 A | * | 10/1978 | Hale et al. .................. 318/561 |
| 4,761,561 A | * | 8/1988 | Fujiwara et al. ............. 250/548 |
| 5,189,806 A | * | 3/1993 | McMurtry et al. ............. 33/503 |
| 5,652,805 A | * | 7/1997 | Ooenoki et al. ............. 382/141 |
| 5,661,671 A | * | 8/1997 | Ooenoki et al. .................. 703/7 |
| 6,549,271 B2 | * | 4/2003 | Yasuda et al. .................. 355/55 |
| 7,162,060 B1 | * | 1/2007 | Barton et al. ................. 382/126 |
| 7,515,772 B2 | | 4/2009 | Li et al. |
| 7,755,754 B2 | * | 7/2010 | Spalding .................... 356/243.1 |
| 8,004,694 B2 | * | 8/2011 | Lee et al. .................... 356/625 |
| 8,013,990 B2 | * | 9/2011 | Spalding .................... 356/243.1 |
| 8,323,724 B2 | * | 12/2012 | Shinohara ...................... 427/66 |
| 2006/0039628 A1 | | 2/2006 | Li et al. |
| 2006/0039629 A1 | | 2/2006 | Li et al. |
| 2007/0026325 A1 | | 2/2007 | Derksen et al. |
| 2008/0127031 A1 | | 5/2008 | Olsson et al. |
| 2010/0142757 A1 | | 6/2010 | Sandstrom et al. |
| 2010/0225974 A1 | * | 9/2010 | Sandstrom ................... 358/3.26 |

FOREIGN PATENT DOCUMENTS

EP 1 482 375 A2 12/2004

OTHER PUBLICATIONS

International Search Report and Written Opinion, Application No. PCT/EP2010/052860, mailed Aug. 31, 2010.
Jan. 30, 2013 Amendment filed in response to Aug. 7, 2012 Office action in U.S. Appl. No. 12/718,895, pp. 1-10.

\* cited by examiner

*Primary Examiner* — Negussie Worku
(74) *Attorney, Agent, or Firm* — Haynes Beffel & Wolfeld LLP; Ernest J. Beffel, Jr.

(57) ABSTRACT

The technology disclosed relates to methods and devices that compensate for displacements in a pattern or deformations of a workpiece. In particular, this relates to using timing to compensate for displacements along a first axis along the scanning direction while using resampling, interpolation or a similar method to compensate for displacements along a second axis that is substantially orthogonal to the first axis. The scanning direction may be an actual direction of movement of the scanning head or it may be a direction perpendicular to an orientation of an image projected onto a workpiece.

20 Claims, 6 Drawing Sheets

Figure 5
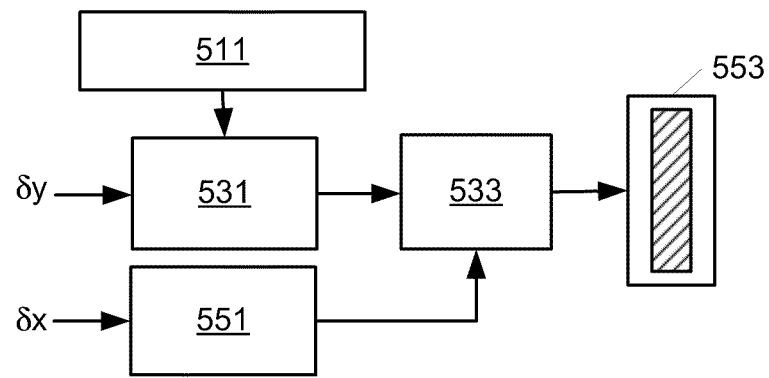
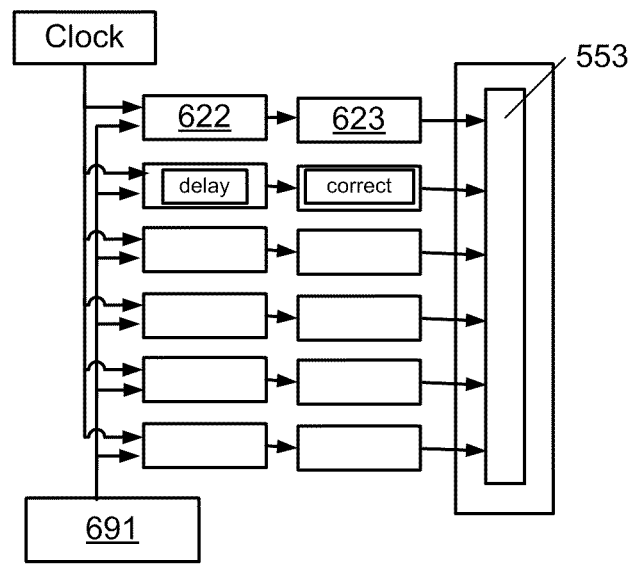
Figure 6

LITHOGRAPHIC PRINTING SYSTEM WITH PLACEMENT CORRECTIONS

RELATED APPLICATION

This application claims the benefit of U.S. Provisional Application No. 61/158,310, filed 6 Mar. 2009, which is hereby incorporated by reference.

This application is related to U.S. patent application Ser. No. 12/718,883, entitled "Rotor Optics Imaging Method and System with Variable Dose During Sweep", filed 5 Mar. 2010, which is currently pending; and U.S. patent application Ser. No. 12/718,900, entitled "Variable Overlap Method and Device for Stitching Together Lithographic Stripes", which issued as U.S. Pat. No. 8,312,393 on 13 Nov. 2012; and U.S. patent application Ser. No. 12/718,895, entitled "Rotor Imaging System and Method with Variable-Rate Pixel Clock", filed 5 Mar. 2010, which is currently pending; all filed contemporaneously. The related applications are incorporated by reference.

This application is related to U.S. patent application Ser. No. 12/706,624, entitled "Improved SLM Device and Method", filed 16 Feb. 2010, which is currently pending. This application is also related to U.S. patent application Ser. No. 12/631,595, entitled "Gradient Assisted Image Resampling In Micro-Lithographic Printing", filed 4 Dec. 2009, which is currently pending. The related applications are incorporated by reference.

BACKGROUND OF THE INVENTION

The technology disclosed relates to methods and devices that compensate for displacements in a pattern or deformations of a workpiece. In particular, this relates to using timing to compensate for displacements along a first axis along the scanning direction while using resampling, interpolation or a similar method to compensate for displacements along a second axis that is substantially orthogonal to the first axis. The scanning direction may be an actual direction of movement of the scanning head or it may be a direction perpendicular to an orientation of an image projected onto a workpiece.

This design team recently has described in patent applications of rotor arm scanning system with very high throughput. The rotor arm scanner can, for instance, be used to write directly to large area masks.

The use of the rotor arm for scanning, instead of a shuttlecock with a reciprocating motion or a fixed head and a moving bed, is a radical departure from standard lithographic and imaging equipment. Use of the rotor presents very challenging data path issues, as the data is presented in a Cartesian grid that requires translation or mapping for use in a polar scanning system, in which the actual scanning path also involves linear motion of the workpiece as the scanning arm rotates.

Accordingly, many new components of a data path need to be developed. Many new problems not presented by prior lithographic technologies need to be identified and solved. Resolution of the many constituent engineering challenges has the potential of contributing to an overall system that has many times the pixel and area coverage throughput of prior, reciprocating systems.

SUMMARY OF THE INVENTION

The technology disclosed relates to methods and devices that compensate for displacements in a pattern or deformations of a workpiece. In particular, this relates to using timing to compensate for displacements along a first axis along the scanning direction while using resampling, interpolation or a similar method to compensate for displacements along a second axis that is substantially orthogonal to the first axis. The scanning direction may be an actual direction of movement of the scanning head or it may be a direction perpendicular to an orientation of an image projected onto a workpiece.

BRIEF DESCRIPTION OF THE DRAWINGS

FIG. 5 depicts a high-level block diagram of correction using a one demodulator.

FIG. 6 depicts additional details of timing control.

DETAILED DESCRIPTION

The following detailed description is made with reference to the figures. Preferred embodiments are described to illustrate the present invention, not to limit its scope, which is defined by the claims. Those of ordinary skill in the art will recognize a variety of equivalent variations on the description that follows.

The technology disclosed relates to a method and apparatus for compensating for scan direction displacements along a first axis by adjusting timing delays in loading an SLM and compensating for the transverse direction displacements along a second axis by resampling in 1D. The 1D resampling may use the gradient assisted resampling method of the related application referenced above.

Applying this technology a pattern is rasterized to a Cartesian coordinate system and then interpolation, translation or resampling is applied to select data to drive a modulator, such as a 1D SLM. The modulator responds to the data as it sweeps a pattern generating beam across the surface of a workpiece. Interpolation can be used in one dimension and time delays in loading the modulator can be used in a second dimension of sweep to adjust the Cartesian pattern to the pattern being drawn by the writing head and modulator. Using rasterized data to load a 1D SLM for swept printing is less complex than loading a 2D SLM for overlapped stamp printing.

1D Resampling

This technology can address placement errors caused by deformation of the workpiece, in software running on a processor, by rasterizing a pattern onto an ideal grid, and determining displacements in a scan direction and a transverse direction. In the scan direction, displacements can be addressed by adjusting timing delays in loading an SLM. In the transverse direction, displacements can be handled by resampling or interpolation in 1D.

This approach compensates for distortion in a workpiece, for instance, between layers that are written, by using local displacement vectors to map the distortion, interpolating or resampling data values along the length of a 1D SLM to compensate in a first direction, and adjusting timing values of data fed along the width of the 1D SLM to compensate in the second direction.

In the following sections, we elaborate on the combination of first axis delay and second axis resampling. Then, we provide expanded descriptions of resampling generally and a rotor system environment in which this technology is particularly useful.

Figure 3:
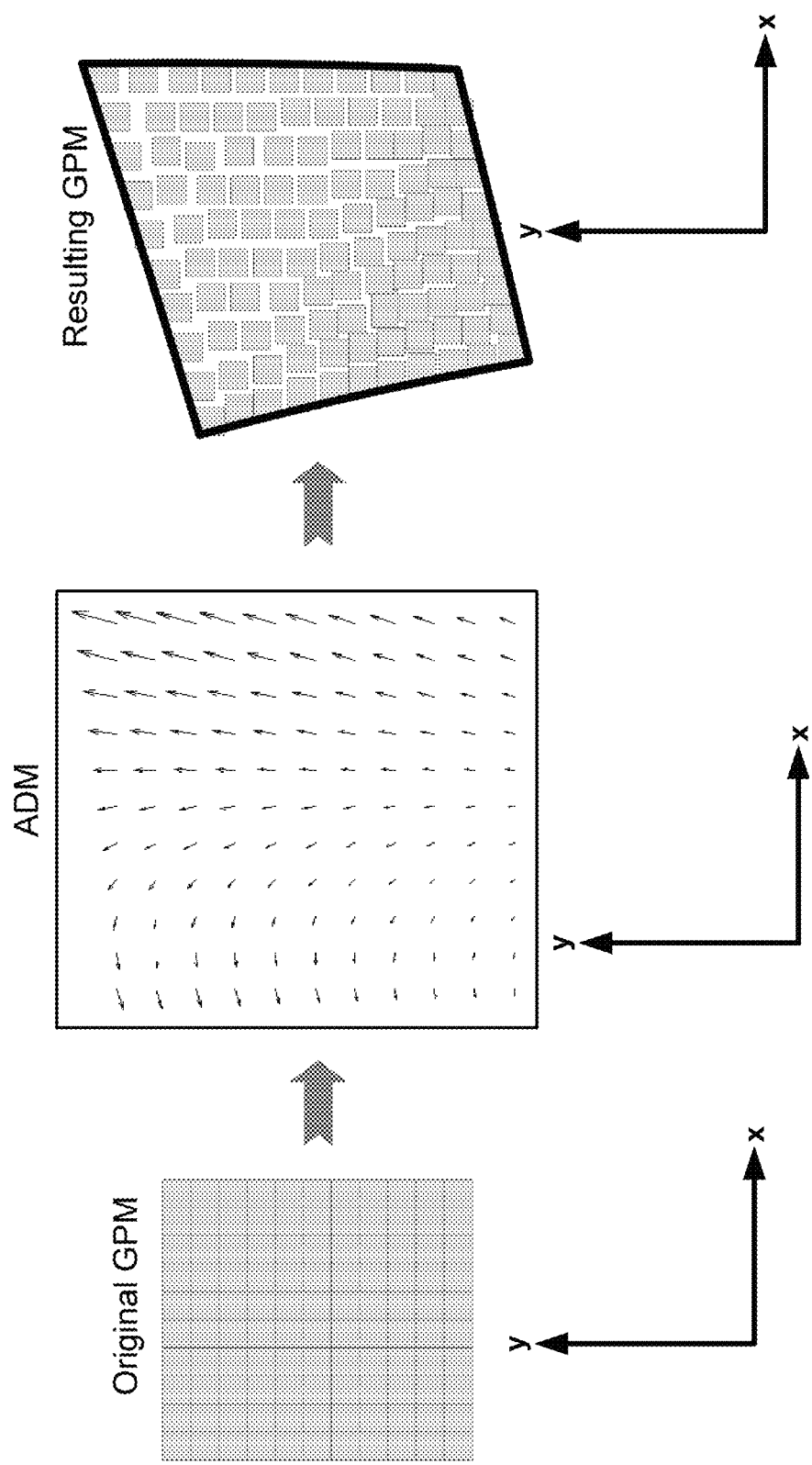
FIG. 3 depicts application of an alignment distortion map (ADM) to a geometric pixel map (GPM) to produce new positions of pixels in the map.

FIG. 3 depicts application of an alignment distortion map (ADM) to a geometric pixel map (GPM) to produce new positions of pixels in the map.

The distortion map supports compensation for alignment errors in the position of the panel and distortions in the panel shape. The map describes how GPM pixels should be relocated to best fit the loaded panel. Points in the map to find the displacement vector that defines a new position for the part of the GPM at the map position. The middle section of FIG. 3 provides an example of displacement vectors as a vector field. Normally the map spans the entire panel or an entire exposure area. The resolution of the alignment distortion map need not match the resolution of the geometric pixel map. For GPM pixels between map points, two-dimensional linear interpolation can be applied.

In one example, consider the exposure area 510×610 mm. The grid typically is chosen according to the distortion frequencies to be mapped. A reasonable grid scale might be 0.1 microns. Map data points include two values, for X and Y displacement. As an order of magnitude, the displacement values might be expected to range between zero and 300 microns for data at the center of the map and up to 600 microns around the edges.

Figure 4:
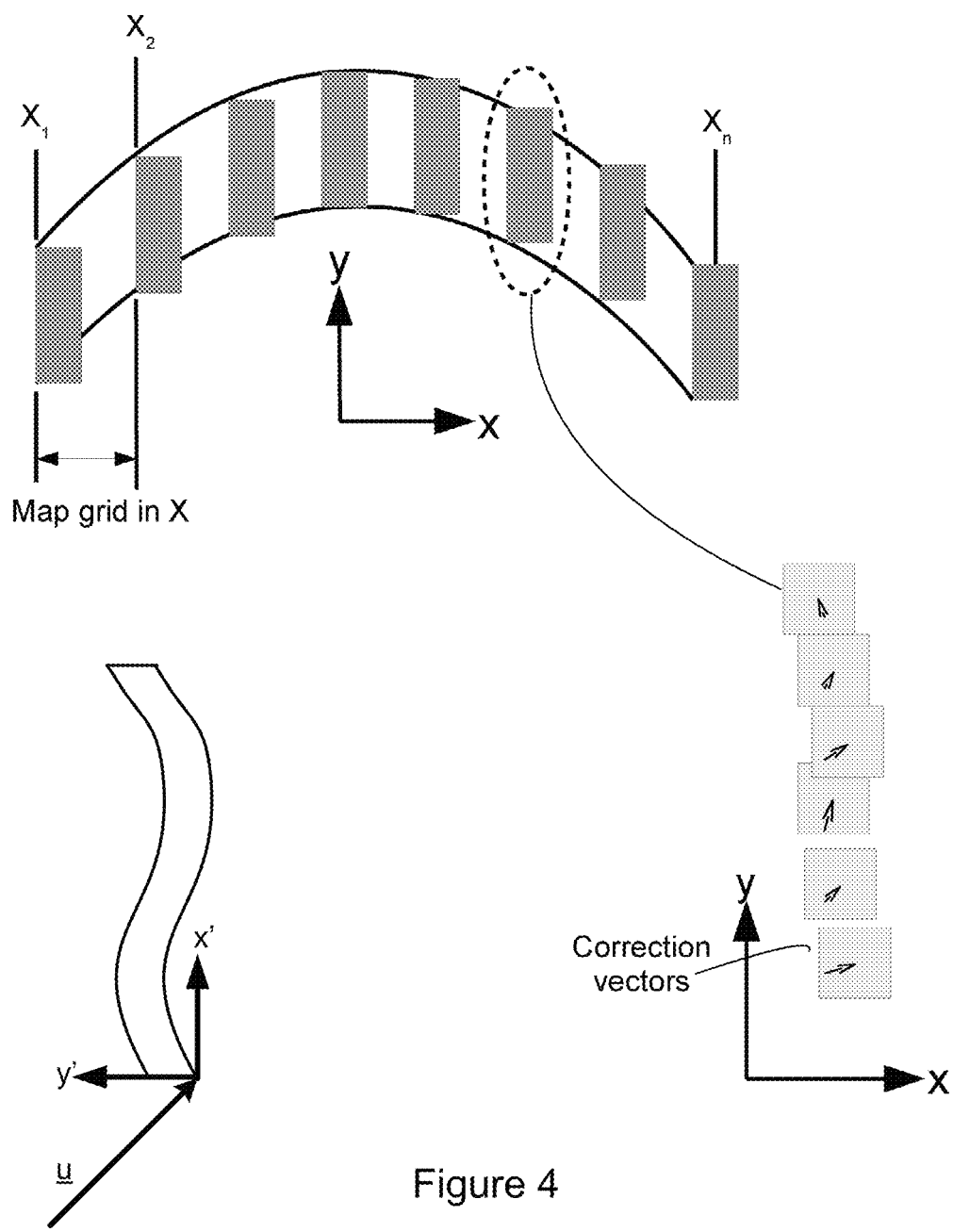
FIG. 4 relates to displacement vectors to pixel values used to sweep a stripe with the rotor.

FIG. 4 relates to displacement vectors to pixel values used to sweep a stripe with the rotor. At the top of FIG. 4, the image projected from the SLM onto the workpiece is represented in a handful of locations. The calligraphy stroke aspect of the stripe painted is apparent from the convergence of the bounding curves toward the sides, at $X_1$ and $X_n$. The inset to the figure depicts six pixels at one projected image. Correction vectors for the respective pixels are shown. The pixels are roughly aligned as the displacement vectors suggest. The curve to the left represents the resulting image from pixels in these locations.

FIG. 5 depicts a high-level block diagram of correction using one demodulator. Along the resolved dimension of the SLM, interpolation or translation can be used, as explained above. Data for interpolation or translation 511 is combined with the displacement vector to calculate 531 individual pixel values for the SLM 553. Along the sweep direction, timing can be used to compensate for displacement. A x-axis component of the displacement vector is fed to a timing processor 551. The timing adjustment is combined with the pixel values by a load controller 533, which feeds the pixel values to the SLM 553. Timing can be handled to a fraction of a degree, such as 1/1000 radian or 0.02 degrees.

FIG. 6 depicts additional details of timing control. Data from a clock and delay specifications 691 are combined in one or more stages 622, 623. Separate delay stages may be applied to compensate for the order of invoking digital to analog converters and for displacement according to the alignment displacement map. After appropriate delays, the pixel values are fed to the SLM 553.

General Resampling

Figure 7:
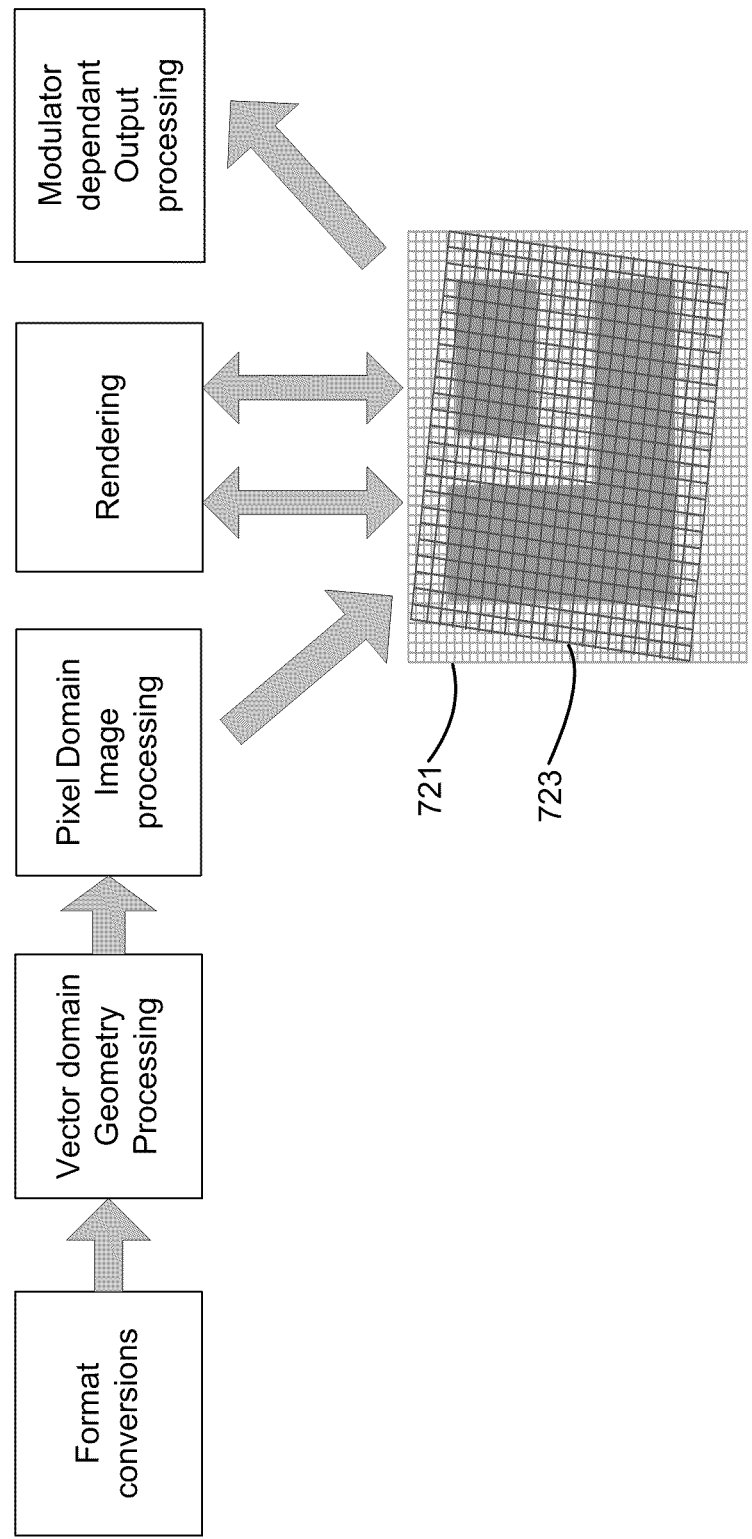
FIG. 7 depicts generic data path.

FIG. 7 depicts a generic data path. In addition to the GPM 721 processing domain and MPM 723 processing domain, discussed above, a third data domain warrants discussion. The vector data domain precedes rasterization to create the GPM. Therefore, the three different data domains are vector data, pixel data in a consolidated Geometrical Pixel Map (the GPM) 721, and pixel data organized for the modulator (the MPM 723, Modulator Pixel Map).

The present disclosure relates to, gradient assisted image re-sampling, individual adjustments of pattern image per printed substrate by re-sampling and a data path architecture where pattern dependent processing and modulator dependent processing can be decoupled.

Data for a pixel-based exposure system that prints in a sequential manner needs to be "flat" (all data contributing to one pixel aggregated) and localized. The pattern represented as a rendered geometrical pixel map (GPM 721) fulfils these properties and makes a suitable format as intermediate storage.

A re-sampling process converts the GPM into modulator pixels in a modulator pixel map (MPM 723). Image processing and morphological operations can also be applied during this re-sampling process. It is possible to apply the image processing and morphological operations at both local parts of the pattern, such as over the exposure system field of view, or globally over the pattern. The image processing and morphological operations include, but are not limited to, scaling, translation, rotation, distortion and sizing. These operations can be used to compensate both for how the exposure system projects pixels onto the mask/substrate and for properties of the mask/substrate.

Due to fidelity requirements and the potential information loss during the re-sampling process, the intermediate pixel map (GPM 721) has a higher resolution than the Modulator Pixel Map (MPM 723). By using gradient information in the re-sampling process, the memory resolution required to satisfy the requirement of the GPM 721 can be significantly reduced.

The majority of the pattern dependent processing steps are done during generation of the GPM 721. The re-sampling is primarily used to handle localized pattern dependent (morphological) operations. It is advantageous to limit re-sampling to localized pattern dependent operations, as this improves the predictability of computational effort for the re-sampling. Predictable computational effort, in turn, makes it easier to optimize the configuration.

The use of the GPM 721 as intermediate storage enables exposure system independence, since processing steps to generate the GPM 721 can be made generic and independent from an exposure system.

Processing requirements for data paths in high resolution microlithography are very challenging, even using the latest and most capable processing hardware. A contributing factor to success in high resolution processing and in high performance computing (HPC), generally, is parallelization. Parallelizing high resolution processing involves dividing the processing into small pieces. Microlithography applications that use the data paths described, process data that has a geographical property, which works within a coordinate system. One convenient way to divide the task is coordinate oriented.

Processing according to the architecture disclosed can be described in two domains, called off-line and on-line. Processing also operates in different data domains. In this disclosure, we refer to processing to create the geometrical pixel maps 721 as "GPM processing." We refer to resampling of the GPM to create the modulator pixel map 723 as "MPM processing." In the first phase of processing, operations are done in a geometrical coordinate system that is independent of modulator type and geometry. The second phase is adapted to a particular modulator. It produces tiles 510 (FIG. 5) that are pieces of modulator data arranged according to requirements from the modulator.

When discussing the data path, we call the abutting parts of an area, covered by the pattern, "tiles" 510. Tiles can be fully described by geometrical coordinates. We refer to tiles in both the GPM processing and the MPM processing, even though the coordinate systems could be quite different between the two.

Our description of the GPM processing refers to square tiles. One should recognize that while rectangular tiles could also be used, especially with a rectangular modulator. Generally, using rectangular tiles would reduce performance, because tiles with long sides will generate more extension zone area. Tiles with long sides are also likely to traverse/cross more cell boundaries than squares tiles thereby creating unnecessary overhead when fetching data.

To make the tiles independent of each other for parallel processing, we use a guard bound or "halo" around the actual tile. We process data in this halo that influences data inside the tile. This "halo" is called an extension zone and is processed in more or less the same way as the rest of the tile. A large extension zone area surrounding a "true tile" area will create unnecessary overhead. One of the factors that influences the size of the halo is the size of the fractured pattern geometries. From simple geometry, a square will have less extension zone area than any rectangle of the same area. Despite a preference for square tiles, present data path implementation also supports rectangle shaped tiles.

Rotor Optics

Environments in which the technology disclosed is particularly useful include a rotating arm printing or viewing device with relay optics with a hub at one end of the arm and optics at the other end, which couple image information with the surface of a workpiece. The optical coupling at the hub may be either on or off the axis of rotation. The following section provides background on the inventive rotor system that is useful for understanding the role of a variable dose or dose compensation function.

A rotor arm system can write to (or read from) a workpiece. It uses a stationary optical image device to modulate (or collect) relayed image information. It relays the image information along optics of at least one rotating arm between the stationary optical image device and a surface of the workpiece. By repeatedly sweeping a curved stripe across the surface of the workpiece, a contiguous image may be written from overlapping partial images by stitching together the partial images on the workpiece.

Pattern information, e.g., a partial image, is relayed between the optical image device and the surface of the workpiece with a substantially constant azimuthal orientation. By "substantially constant," we include a small rotation that is within tolerances or that is corrected in rasterizing, producing no more than a 0.5 degree rotational variation in the angular relationship when the relayed versions are separated by more than 5 degrees sweep of the rotating optical arm.

The rotor can have several arms, e.g. 2, 3, 4, 6, or 8 arms, thereby multiplying the scanned surface area per time unit. Heavy, complex, fragile machine parts, or parts that are expensive or need many connections and services can be placed stationary near the center or hub of the rotor and be shared by the multiple arms. An image is relayed between a stationary image device placed at or near the hub of the rotor and the workpiece, through the radial arm.

The rotor system is described by reference to relay optics because it can be used to write to or read from a workpiece. For instance, it is useful to write directly to a large area mask or a PCB. Or, it can be used to inspect a large area mask. It is used with a workpiece positioning mechanism, such as a stage, details of which are outside the scope of this disclosure.

Figure 1:
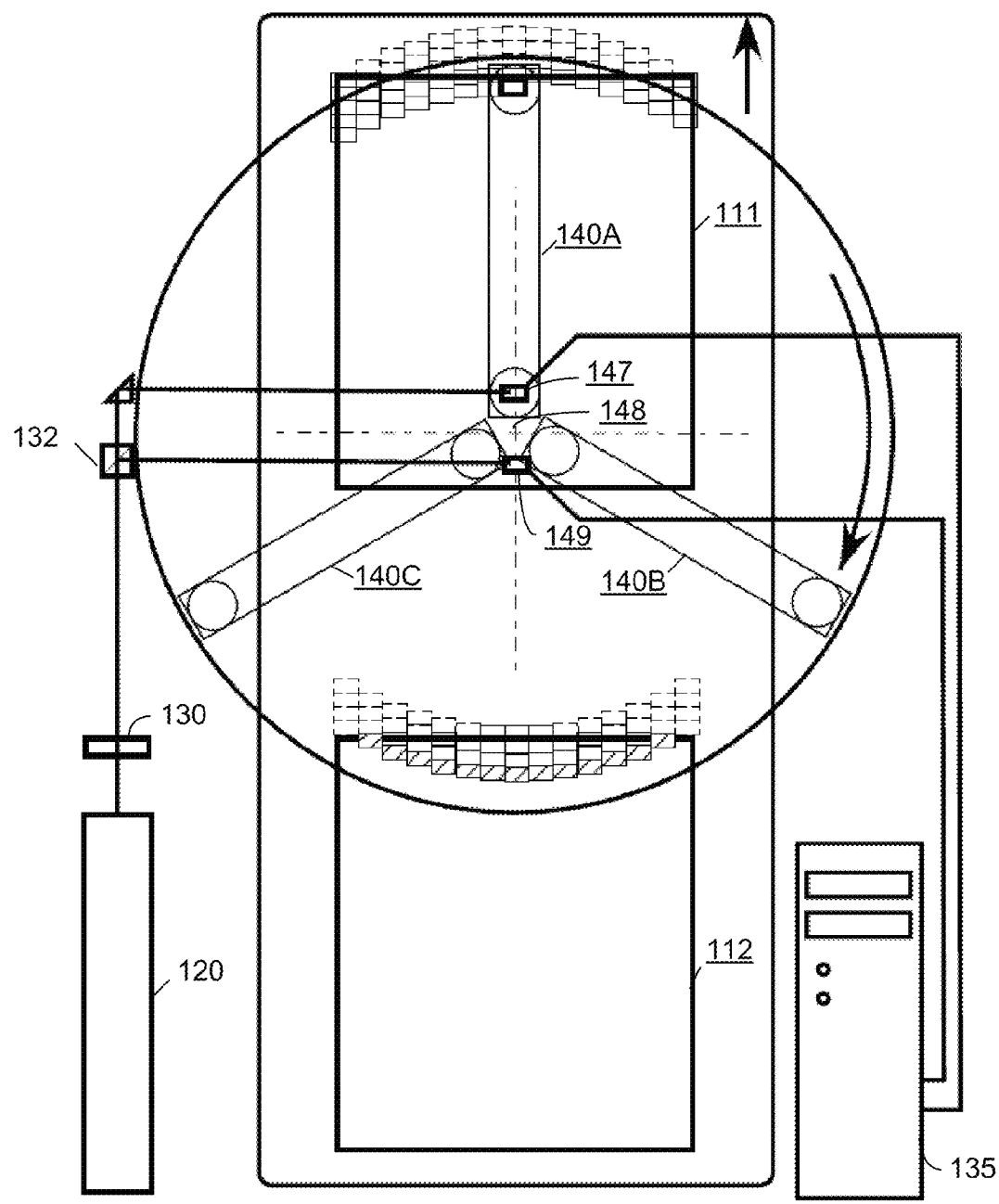
FIG. 1 depicts a scanning system with three arms and a pair of workpieces 111, 112 being written on opposite sides of the hub 148.

FIG. 1 depicts a rotor scanning system with three arms and a pair of workpieces 111, 112 being written on opposite sides of the hub 148. This system may have a duty cycle of 100%. Each rotor writes through an arc of 60 degrees. Only one arm 140 writes at a time, alternatively on the two workpieces 111 and 112. The laser energy is switched by polarization control 132 between the two SLMs 147 and 149, and the data stream is also switched between the SLMs. Since the laser 120 and the data path 135 are among the most expensive modules in a writing machines, this embodiment has been designed to use laser and data channel 100% of the time while the SLMs and the optics in the arms has lower duty cycles, 50% and 33% respectively. This may be, for instance, an example of a writing system with three rotating arms 140A-C. There are a variety of alternative designs for these arms and the relay optics. The figure conceptually depicts a laser 120 and a controller 135 sending data to two SLMs 130 which are relayed 132, 147, 149 to the rotating arms. It shows how each arm moves in front of each SLM and writes a series of concentric stamps on the workpieces 111, 112. While two workpieces are shown in this figure, more workpieces could be positioned under a rotor, depending on its size. While the example is described as a writing system, the direction of relay could just as easily be from the workpiece back to a pair of detectors positioned where the laser 120 is and elsewhere. In alternative configurations, one workpiece might be used; four arms might be used.

Some particularly useful applications of this technology involve writing patterns on electronic substrates, such as: wafers' front and back sides; PCBs; build-up, interposer and flexible interconnection substrates; and masks, stencils, templates and other masters. Likewise, the rotor writer can be used for patterning panels in displays, electronic paper, plastic logic and photovoltaic cells. The patterning can be done by exposure of photoresist, but also through other actions of light such as thermal or photochemical processes: melting, evaporation, ablation, thermal fusing, laser-induced pattern transfer, annealing, pyrolytic and photo induced etching and deposition.

A rotor system replaces the customary motion of a Cartesian flatbed xy stage with a polar scanning motion. Potential benefits include high throughput, low cost and mechanical simplicity. The scanning action is done by a rotating motion, which is mechanically easier to build to high accuracy than straight-line motion. The position accuracy of a point on the periphery of the rotor is determined by the quality of a bearing and the accuracy of an angle encoder. Both of these components can be sourced with high quality. A rotational reduces vibrations and transient forces during scanning and between scanning strokes. A well-balanced rotor emits essentially no vibrations or reactive forces to the supporting structure, while reciprocating straight movements need to reverse their momentum twice per stroke and create strong disturbances when doing so. A rotor may have a higher scanning velocity with less mechanical overhead. A rotor with several arms uses nearly the whole circle for writing. For instance, a rotor with four arms may scan through an 80 degree arc. Out of the 360 degrees in a circle, the rotor scans during 4×80=320 degrees. A reciprocating movement needs more mechanical overhead. The overhead for reciprocating movement gets larger with increased scanning velocity.

Rotor systems may have a very high data rate and throughput and may be used for other types of patterning where these characteristics are useful: photo-setting, printing, engraving, security marking, etc. The rotor has a smooth movement and small mechanical overhead even at high rotation speeds, e.g. 60, 120, 300, 600 r.p.m. or higher. The scanning speed, which is the peripheral speed of the rotor, may be higher than comparable reciprocating systems, e.g. 2, 4, 8, 20 m/s or higher.

In practical terms, one implementation would have a rotor one meter in diameter, spinning 3.3 turns per second with a centripetal acceleration of 20 g. The acceleration force gives a constant force on rotating components, such that a lens weighing 50 grams will feel a constant force outwards of 10 N. With four arms and rotational speed, the system writes 13 strokes per second with a peripheral velocity of 10 m/s, a mechanical speed that is impractical with a reciprocating stage. Furthermore, with proper balancing and design of the bearings the motion will be smooth, have high mechanical precision and need little power to be sustained. If the image generator is a micromechanical 1D SLM with constant 2 MHz frame rate used for creating a 1D partial image on the workpiece, the reloading of the SLM would occur every 5 microns along the scanning direction and the pixel size could be 5×5 microns, allowing line width of less than 15 microns to be written. With a micromechanical 1D SLM, effectively having 8000×1 pixels, each stroke would fill a stripe 40 mm wide with pattern, and cover—with some reduction for the non-straight scan—0.3 square meters per second or 20 square meters per minute. This is a very high coverage rate, compared to other writing technologies.

Figure 2:
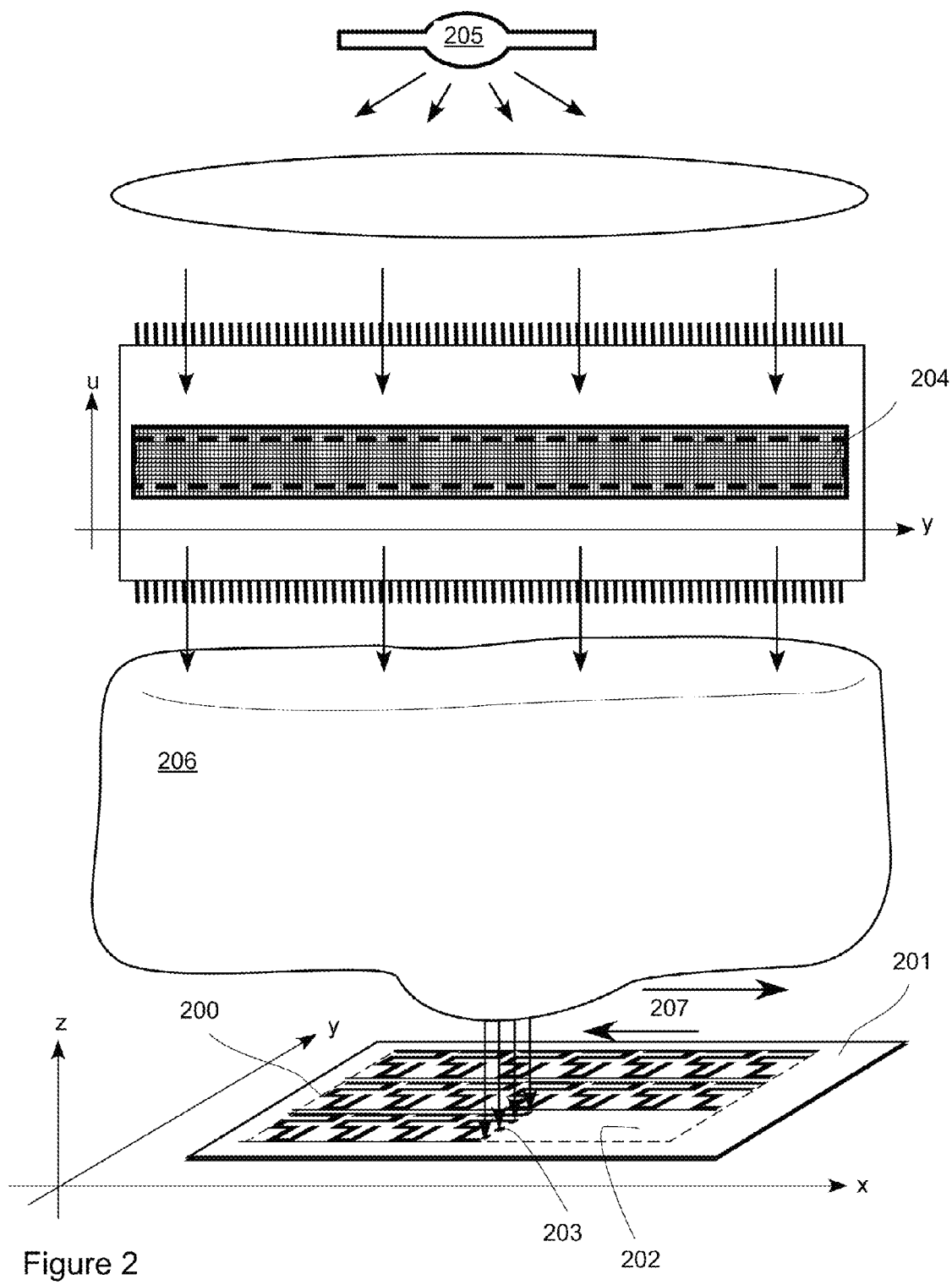
FIG. 2 further describes use of a so-called one-dimensional SLM with anamorphic optics.

FIG. 2 further describes use of a so-called one-dimensional SLM with anamorphic optics. A light source 205 (arc lamp, gas discharge, laser, array of lasers, laser plasma, LED, array of LEDs etc.) illuminates a one-dimensional SLM 204. The reflected (or transmitted in the general case) radiation is projected as a line segment 203 on a workpiece 201. The data driving the SLM changes as the workpiece is scanned 207 to build up an exposed image. A strongly anamorphic optical system 206 concentrates energy from multiple mirrors in a column (or row) to point in the image and the entire two-dimensional illuminated array forms a narrow line segment 203 that is swept across the workpiece. In one dimension, the anamorphic optics demagnify the illuminated area, for instance, by 2× to 5×, so the a 60 millimeter wide SLM would image onto a line segment 30 to 12 mm long. Along the short dimension, the anamorphic optics strongly demagnify the column of mirrors to focus onto a narrow area such as 3 microns wide, i.e. essentially a single resolved line. Alternatively, the area could be 1 or 5 microns wide or less than 10 microns wide. Focus onto a 3 micron wide area could involve an 80× demagnification, from approximately 240 microns to 3 microns. The anamorphic optical path demagnifies the row of mirrors to an extent that individual mirrors are combined and not resolved at the image plane. As described in related applications, the SLM could be positioned in a plane that is in sharp focus along one dimension of the SLM and de-focused along the other dimension. This would decrease the criticality of the lens system.

A rotor enables many image processing instruments to be used on large flat substrates and scanning at high speed, e.g. on solar panels, display substrates, sheet metal, architectural glass, roll-to-roll plastic, paper, and the like. Through the rotating arms an image may be captured at the periphery and transferred to the hub where a camera or an optical analytical instrument may be situated, e.g. a reflectometer, spectrophotometer, scatterometer, multispectral camera, polarimeter, fluorescence or photo-luminescence instrument. Instruments that are complex, bulky or fragile can be mounted fixed at the hub and still access any point on the surface of, say, a two meter wide thin-film photovoltaic panel passing on a conveyor under the rotor, thereby enabling full-area inspection or analysis at dense grids on large workpieces without removing sheets for analysis or stopping the roll-to-roll flow. The rotor may have only flat optics or it may have reflecting relays in the arms, allowing achromatic use from far IR to deep UV. The illumination, e.g. UV for fluorescence studies, may be brought from the hub or it may be generated within the rotor.

As mentioned above, the disclosed technology enables many instruments to be used on large flat substrates and scanning at high speed, e.g. on solar panels, display substrates, sheet metal, architectural glass, roll-to-roll plastic, paper, and the like. Through the rotating arms an image may be captured at the periphery and transferred to the hub where a camera or detector (e.g., a vidicon, CCD, CID, CMOS device, and/or a TDI, intensified, gated, avalanche, single photon, photon-counting, interferometric, colorimetric, heterdyne, photoconductive or bolometric detector or array) is located, or an optical analytical instrument may be situated, (e.g., a reflectometer, spectrophotometer, colorimeter, scatterometer, multispectral camera, polarimeter, or a fluorescence, photo-luminescence or photoacoustic instrument).

Other possible uses are for optical measurements of heat (infrared emission), color, flatness, smoothness, film thickness, chemical composition, cleanliness, or for verification of pattern integrity or fidelity. The method is particularly beneficial where an image of the surface or an exact location of a found defect or feature is needed. Instruments that are complex, bulky or fragile can be mounted fixed at the hub and still access any point on the surface of, say, a two meter wide thin-film photovoltaic panel passing on a conveyor under the rotor, thereby enabling full-area inspection or analysis at dense grids on large workpieces without removing sheets for analysis or stopping the roll-to-roll flow. The rotor may have only flat optics or it may have reflecting relays in the arms, allowing achromatic use from far IR to deep UV. The illumination (e.g. visible incident light for reflected-light microscopy) may be brought from the hub or it may be generated within the rotor. Several instruments and or writing modes may be combined in one rotor, either by being combined in one optical arm or by employing different ones. At least one instrument or optical image device may emit an exciting beam through an arm and receives an image back from the workpiece, e.g. UV for fluorescence studies. The rotation may be continuous with a constant or varying angular speed or alternatively be driven by in a stop and go fashion, in particular for random-access analysis of workpieces. Focusing of the imaging optics may be fixed, variable from time to time or dynamic during scanning and based on feedback from focus sensors based on interferometry, back-reflection, proximity to a fiber end, optical triangulation, optical defocus or parallax; fluid flow, pressure or viscous resistance; ultrasound time-of-flight or phase; capacitance, inductance or other suitable phenomena indicating a distance or position.

Some Particular Embodiments

The technology disclosed may be practiced as a method, device or system. One method corrects deformations from an ideal rasterized pattern when projecting an image onto a workpiece. This method includes rasterizing pattern data to an ideal grid and representing displacements across the area that correct for deformations from the ideal pattern data. Optionally, the displacements may be represented as displacement vectors. The method further includes delivering data to a modulator having numerous pixels oriented along at least the transverse direction, using timing of the data delivery to compensate for the displacements in the scan direction and calculating pixel data values that compensate for the displacements in the transverse direction.

In some implementations of this method, the modulator projects an image onto a workpiece, with the modulator relaying the image along a rotating arm through optics that maintain a substantially constant orientation of the projected image onto the workpiece relative to a first axis. These implementations further include using the timing of the data delivery to compensate for the displacements in the scan direction, defined as perpendicular to a major axis of the projected image. In these implementations, the printing head on the rotor traces an arc in a constantly changing direction. Still, the constant orientation of the projected image permits the scan direction to be defined relative to the image orientation. The scan direction is a line, rather than an arc.

Another aspect of the foregoing method includes retrieving the rasterized pattern data from one or more columns of a Cartesian data grid and combining the columns of data to calculate pixel data values that compensate for the displacements in the transverse direction by resampling from the rasterize pattern data to lower resolution modulator pattern data. In this context, resampling includes converting higher resolution rasterize data to lower resolution modulator data.

An alternative to resampling includes retrieving the rasterize pattern data from at least one column of the Cartesian data grid and interpolating between data values in the column to produce pixel data values that compensate for the displacements in the transverse direction.

A further aspect that can be combined with any of implementations, aspects for alternatives above, includes updating some of the displacement vectors that correct the deformations while delivering the data to the modulator that compensates for the deformations using others of the displacement vectors.

Another method that practices the technology disclosed compensates for distortion of a workpiece while printing rasterize data using a modulator having numerous pixels along at least a length of the modulator. This method includes accessing local displacement vectors stored in memory that map compensation for distortion of workpiece and calculating data values along the length of a modulator to compensate for the distortion in a first direction. The method further includes adjusting timing of data feed to the modulator to compensate for the distortion in a second direction, substantially orthogonal to the first direction.

In general, the implementations, aspects and alternatives applied to the first method also apply to the second method. In some implementations, the modulator projects an image onto a workpiece, with the modulator relaying the image along a rotating arm through optics that maintain a substantially constant orientation of the projected image onto the workpiece relative to a first axis. These implementations further include using the timing of the data delivery to compensate for the displacements in the scan direction, defined as perpendicular to a major axis of the projected image. In these implementations, the printing had on the rotor traces an arc in a constantly changing direction. Still, the constant orientation of the projected image permits the scan direction to be defined relative to the image orientation. The scan direction is a line, rather than an arc.

The aspects of alternative of resampling our interpolating, described above, applies to this method. In some embodiments, this method is combined with updating some of the displacement vectors that correct for the distortion of the workpiece while feeding the data to the modulator.

Various devices also implement the technology disclosed. One is a deformation correction device that corrects for deformations from an ideal rasterize pattern when projecting an image onto a workpiece. This device includes a memory and at least one processor coupled to the memory. It includes a first module running on the processor that rasterizes pattern data to an ideal grid and an alignment displacement map stored in the memory that represents deformations across a workpiece from the ideal grid in a scan direction and a transverse direction as displacement vectors. The device further includes a modulator having numerous pixels oriented along the least the transverse direction, the modulator coupled to the processor. A second module running on the processor delivers data to the modulator using timing of the data delivery to compensate for the displacements in the scan direction and calculating pixel data values that compensate for the displacements in the transverse direction.

Generally, the aspects, implementations and alternatives applicable to the methods above also can be combined with this device.

Some implementations of this device further include an optical path along a rotating arm from the modulator projects to a workpiece. The modulator and optical path relay an image to the workpiece while maintaining a substantially constant orientation of the projected image on the workpiece relative to a first axis. In this implementation, the scan direction is defined as perpendicular to a major axis of the projected image.

In one aspect, the second module retrieves the rasterized pattern data from one or more columns of a Cartesian data grid and resamples the columns of data from the ideal grid to a lower resolution for the delivery to the modulator. Alternatively, the second module retrieves the rasterized pattern data from at least one column of a Cartesian data grid and interpolates between data values in the column to produce pixel data values that compensate for the displacements in the transverse direction.

A further aspect, which can be combined with any the implementations, aspects or alternatives above, includes a third module running on the processor that updates some of the displacement vectors in real time. The third module corrects some of the displacement vectors while the second module delivers the data to the modulator using others of the displacement vectors.

Another device that practices the technology disclosed compensates for distortion of a workpiece in rasterized data adapted for use by a modulator having numerous pixels along at least a length of the modulator. This device includes a memory and at least one processor coupled to the memory. It includes displacement vectors stored in the memory that map compensation for distortion in a first direction and in a second direction, substantially orthogonal to the first direction. A first module runs on the processor, that accesses the displacement vectors and calculates data values of pixels along the length of a modulator to compensate in data for the distortion in the first direction. A second module runs on the processor, that adjusts timing of data feed to the modulator to compensate for the distortion in the second direction.

Each of the aspects, implementations and alternatives describes the methods and the first device also can be applied to the second device.

I claim as follows:

1. A method of correcting for deformations from an ideal rasterized pattern when projecting an image onto a deformed workpiece, the method including:
rasterizing pattern data to an ideal grid;
representing displacements across an area of the workpiece that correct deformations from the ideal grid as displacement vectors; and
delivering data to a modulator having numerous pixels oriented along at least a transverse direction, using timing of the data delivery to compensate for the displacements in a scan direction and calculating pixel data values that compensate for the displacements in the transverse direction.

2. The method of claim 1, wherein the modulator projects an image onto a workpiece, the modulator relaying the image along a rotating arm through optics that maintain a substantially constant orientation of the projected image on the workpiece relative to a first axis, further including using the timing of the data delivery to compensate for the displacements in the scan direction, defined as perpendicular to a major axis of the projected image.

3. The method of claim 1, further including retrieving the rasterized pattern data from one or more columns of a Cartesian data grid and combining data values in the columns of data to calculate pixel data values that compensate for the displacements in the transverse direction by resampling from the rasterized pattern data to lower resolution modulator pattern data.

4. The method of claim 1, further including retrieving the rasterized pattern data from at least one column of a Cartesian data grid and interpolating between data values in the column to produce pixel data values that compensate for the displacements in the transverse direction.

5. The method of claim 1, further including updating some of the displacement vectors that correct the deformations while delivering the data to the modulator that compensates for the deformations using others of the displacement vectors.

6. A method of compensating for distortion of a workpiece while printing rasterized pattern data using a modulator having numerous pixels along at least a length of the modulator, the method including:
accessing local displacement vectors stored in memory that map compensation for distortion of the workpiece;
calculating data values along the length of a modulator to compensate for the distortion in a first direction; and
adjusting timing of data feed to the modulator to compensate for the distortion in a second direction, substantially orthogonal to the first direction.

7. The method of claim 6, wherein the modulator projects an image onto a workpiece, the modulator relaying the image along a rotating arm through optics that maintain a substantially constant orientation of the projected image on the workpiece relative to a first axis, further including using the timing of the data feed to compensate for the displacements in the second direction, defined as perpendicular to a major axis of the projected image.

8. The method of claim 6, further including retrieving rasterized pattern data from one or more columns of a Cartesian data grid and combining data values in the columns of data to calculate pixel data values that compensate for the displacements in the first direction by resampling from the rasterized pattern data to lower resolution modulator pattern data.

9. The method of claim 6, further including retrieving the rasterized pattern data from at least one column of a Cartesian data grid and interpolating between data values in the column to produce pixel data values that compensate for the displacements in the first direction.

10. The method of claim 6, further including updating some of the displacement vectors that correct for the distortion of the workpiece while feeding the data to the modulator.

11. A deformation correction device that corrects for deformations from an ideal rasterized pattern when projecting an image onto a deformed workpiece, the device including:
a memory;
at least one processor coupled to the memory;
a first module running on the processor that rasterizes pattern data to an ideal grid;
an alignment displacement map stored in the memory that represents deformations across a workpiece from the ideal grid in a scan direction and a transverse direction as displacement vectors;
a modulator having numerous pixels oriented along the least the transverse direction, the modulator coupled to the processor; and
a second module running on the processor that delivers data to the modulator using timing of the data delivery to compensate for the displacements in the scan direction and calculating pixel data values that compensate for the displacements in the transverse direction.

12. The device of claim 11, further including an optical path along a rotating arm from the modulator that projects an image onto a workpiece, wherein the modulator and optical path relays an image to the workpiece that maintains a substantially constant orientation of the projected image on the workpiece relative to a first axis, wherein using the timing of the data delivery to compensate for the displacements in the scan direction defines the scan direction as perpendicular to the first axis.

13. The device of claim 11, further wherein the second module retrieves the rasterized pattern data from one or more columns of a Cartesian data grid and resamples the columns of data from the ideal grid to a lower resolution for the delivery to the modulator.

14. The device of claim 11, further wherein the second module retrieves the rasterized pattern data from at least one column of a Cartesian data grid and interpolates between data values in the column to produce pixel data values that compensate for the displacements in the transverse direction.

15. The device of claim 11, further including a third module running on the processor that updates some of the displacement vectors that correct the deformations while the second module delivers the data to the modulator that compensates for the deformations using others of the displacement vectors.

16. A device that compensates for distortion of a workpiece in rasterized pattern data adapted for use by a modulator having numerous pixels along at least a length of the modulator, the device including:
a memory;
at least one processor coupled to the memory;
displacement vectors stored in the memory that map compensation for distortion in a first direction and in a second direction, substantially orthogonal to the first direction;
a first module running on the processor, accessing the displacement vectors and calculating data values of pixels along the length of a modulator to compensate in data for the distortion in the first direction; and
a second module running on the processor, that adjusts timing of data feed to the modulator to compensate for the distortion in the second direction.

17. The device of claim 16, further including optics coupled to the modulator that project an image along a rotating arm onto a workpiece while maintaining a substantially constant orientation of the projected image on the workpiece relative to a first axis, further including using the timing of the data feed to compensate for the displacements in the second direction, defined as perpendicular to the first axis.

18. The device of claim 16, wherein the second module retrieves rasterized pattern data from one or more columns of a Cartesian data grid and combines the data values in the columns by resampling rasterized pattern data to lower resolution to be fed to the modulator.

19. The device of claim 16, wherein the second module retrieves rasterized pattern data from one or more columns of a Cartesian data grid and interpolates between data values in the columns to produce pixel data values that compensate for the displacements in the first direction.

20. The device of claim 16, further including a third module running on the processor that updates some of the displacement vectors that correct the distortions while the second module delivers the data to the modulator that compensates for the distortions using others of the displacement vectors.

\* \* \* \* \*